United States Patent
Gabriel et al.

(10) Patent No.: US 12,325,044 B2
(45) Date of Patent: Jun. 10, 2025

(54) METHOD FOR PROTECTING AIR-SENSITIVE OR EVAPORATION-SENSITIVE OBJECTS

(71) Applicant: COMMISSARIAT A L'ENERGIE ATOMIQUE ET AUX ENERGIES ALTERNATIVES, Paris (FR)

(72) Inventors: Jean Christophe Gabriel, Quaix-en-Chartreuse (FR); Monika Spano, Charavines (FR); Fatima-Ezzahra Hami, Grenoble (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 108 days.

(21) Appl. No.: 17/774,582

(22) PCT Filed: Nov. 6, 2020

(86) PCT No.: PCT/FR2020/052017
§ 371 (c)(1),
(2) Date: May 5, 2022

(87) PCT Pub. No.: WO2021/089957
PCT Pub. Date: May 14, 2021

(65) Prior Publication Data
US 2022/0410204 A1    Dec. 29, 2022

(30) Foreign Application Priority Data
Nov. 8, 2019   (FR) ..................................... 1912558

(51) Int. Cl.
*B05D 1/20* (2006.01)
*H10K 71/10* (2023.01)
(Continued)

(52) U.S. Cl.
CPC ............. *B05D 1/204* (2013.01); *H10K 71/10* (2023.02); *H10K 85/324* (2023.02); *H10K 85/40* (2023.02);
(Continued)

(58) Field of Classification Search
CPC .......... B05D 1/28; B05D 1/204; H10K 71/10; H10K 85/701; H10K 85/40
See application file for complete search history.

(56) References Cited

U.S. PATENT DOCUMENTS 5,726,113 A * 3/1998 Pinnavaia ................ B01J 21/16
                                                    502/80
7,214,468 B2 * 5/2007 Takahashi ................ B41N 1/14
                                                    430/944
(Continued)

FOREIGN PATENT DOCUMENTS

CN     105070515 A    11/2015
CN     106865627 A     6/2017
WO     2007132089 A2  11/2007

OTHER PUBLICATIONS

International Search Report mailed Jan. 20, 2021, in corresponding to International Application No. PCT/FR2020/052017; 7 pages (with English Translation).
(Continued)

*Primary Examiner* — Michael P Wieczorek
(74) *Attorney, Agent, or Firm* — Maier & Maier, PLLC

(57) ABSTRACT

A method for depositing a film on a substrate, which includes the steps of forming a film using a liquid composition that includes a neutral surfactant and a charged lamellar compound, placing the film in contact with the substrate and depositing the film on substrate. Also, a process for analyzing a substrate onto which a film has been deposited by the method.

15 Claims, 4 Drawing Sheets a)   b)   c)

(51) Int. Cl.
  *H10K 85/00* (2023.01)
  *H10K 85/30* (2023.01)
  *H10K 85/40* (2023.01)
  *H10K 102/00* (2023.01)

(52) U.S. Cl.
  CPC ....... *H10K 85/701* (2023.02); *H10K 2102/00* (2023.02)

(56) References Cited

U.S. PATENT DOCUMENTS 8,821,957 B2 * 9/2014 Benattar ................ B82Y 40/00
  427/430.1
2009/0197064 A1 8/2009 Benattar

OTHER PUBLICATIONS

Joël Azevedo et al.; "Highly Ordered Monolayer, Multilayer, and Hybrid Films of Graphene Oxide Obtained by the Bubble Deposition Method"; Journal of Physical Chemistry C, vol. 115; No. 30; Aug. 4, 2011; XP055063885; pp. 14678-14681.

Joël Azevedo et al.; "Supporting information: Highly-ordered monolayer, multilayer and hybrid films of graphene oxide by Bubble Deposition Method"; Jun. 24, 2011; XP055714266; 2 pages.

\* cited by examiner

[Fig. 1]
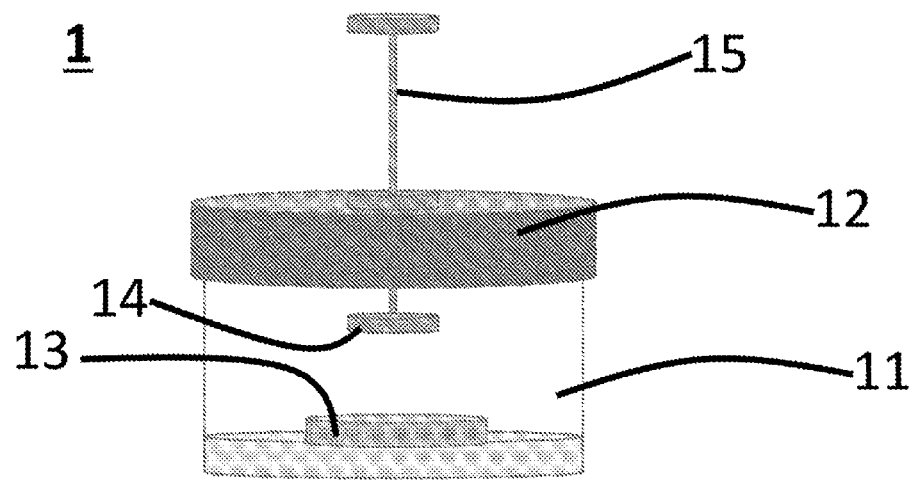
[Fig. 2]
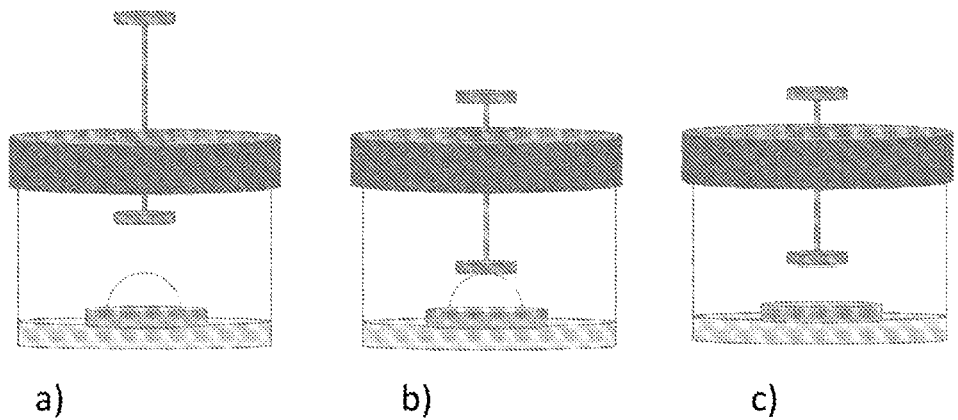
a)   b)   c)

[Fig. 3]
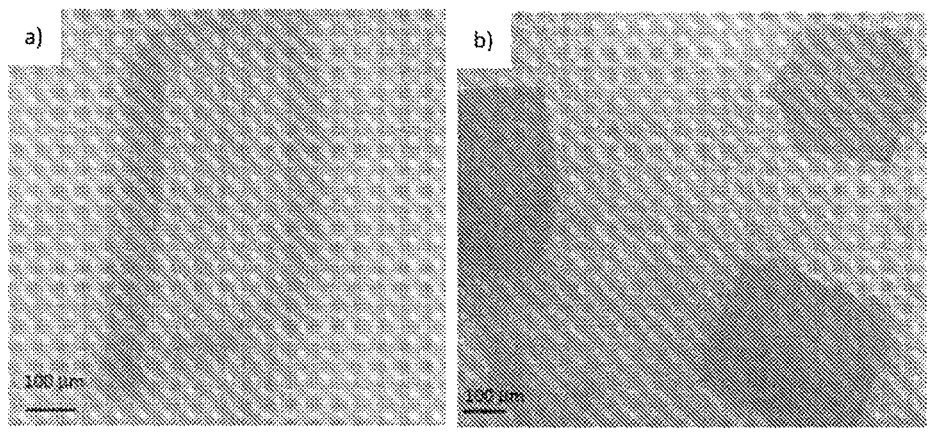
[Fig. 4]
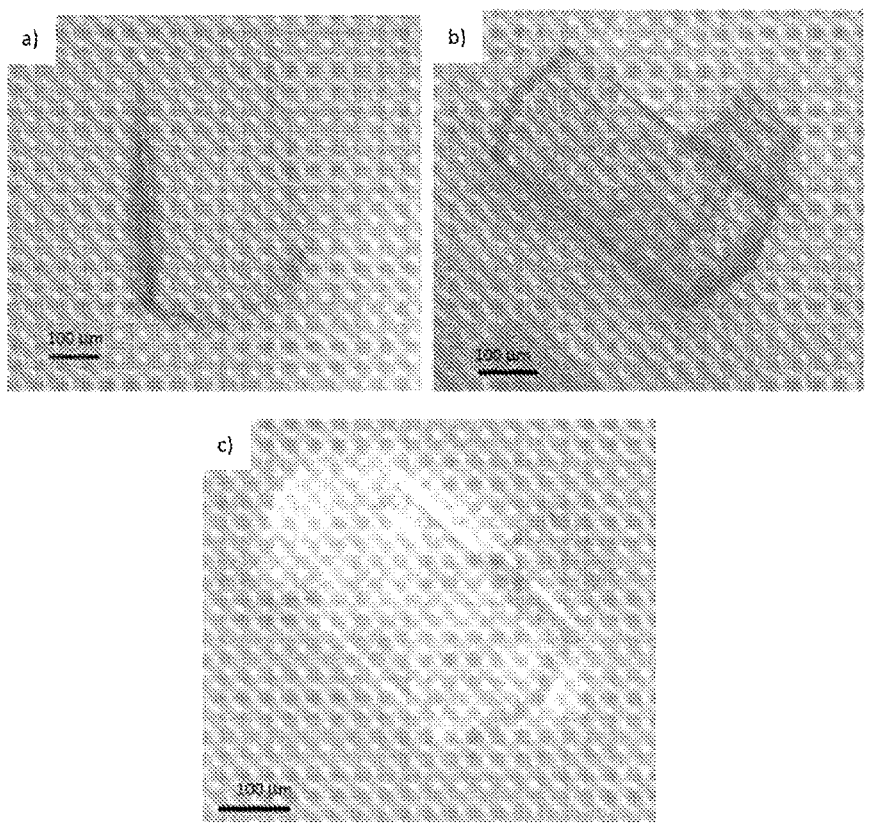

[Fig. 5]
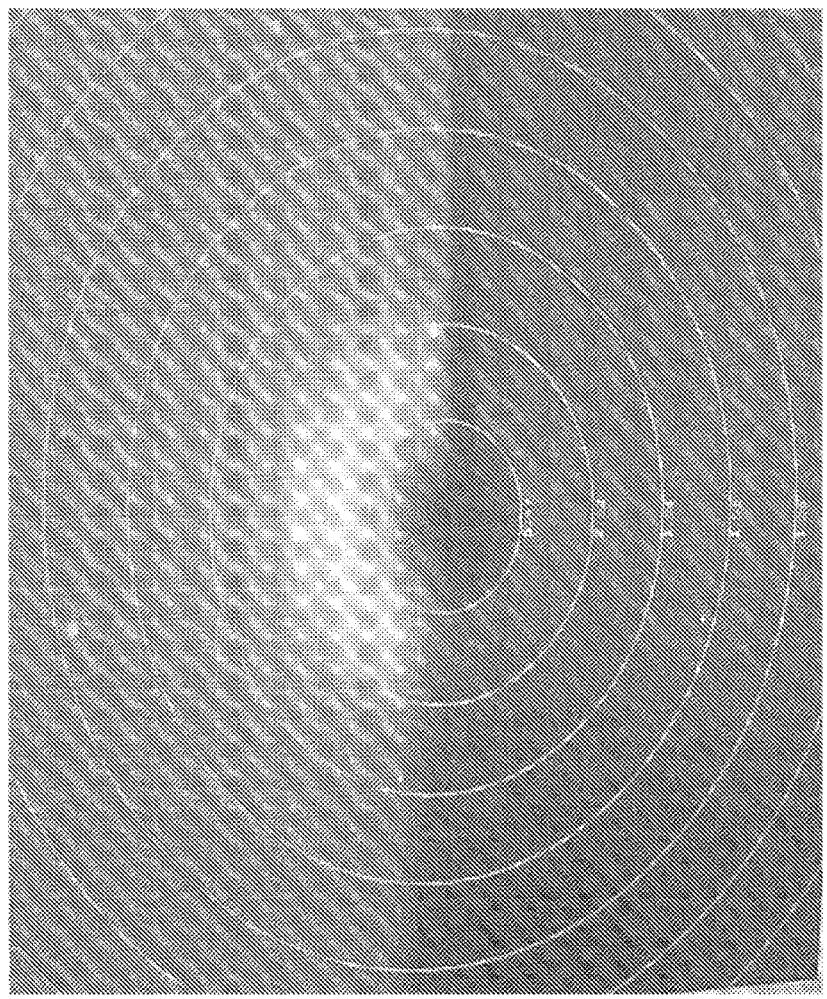

[Fig. 6]
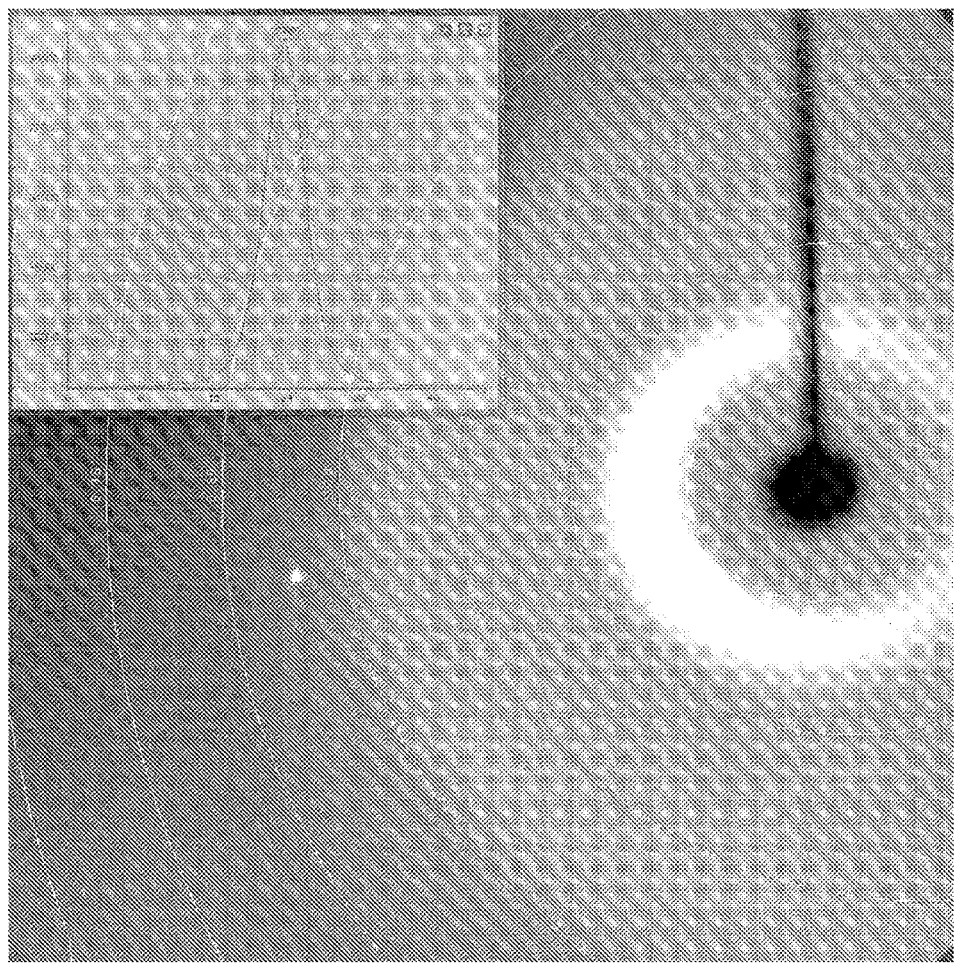

METHOD FOR PROTECTING AIR-SENSITIVE OR EVAPORATION-SENSITIVE OBJECTS

FIELD

The present specification relates to the field of thin films deposited onto air-sensitive or evaporation-sensitive substrates such as protein crystals.

BACKGROUND

Certain substrates, such as protein crystals or organic semiconductors used in organic light-emitting diodes, are particularly unstable and fragile. Indeed, protein crystals are unstable in air and are sensitive to variations in the various physicochemical parameters of their growth medium, such as the pH, the temperature or the ionic strength.

The air-sensitivity of protein crystals poses a problem when they are to be isolated in order to be placed in an X-ray or electron beam to study their three-dimensional structure by X-ray diffraction or electron diffraction.

A first conventional solution for preserving protein crystals is cryogenics. Cryogenics consists in placing the crystal to be studied at the end of a sample support and immersing it in a stream of cooled nitrogen. This cooling makes it possible to avoid the evaporation of the solvent contained in the crystal, the problems of thermal instability of the crystal and any degradation due to the intense and strongly ionizing X-ray radiation. However, protein crystals, in particular those comprising a large amount of water, may be sensitive to the decrease in temperature. Indeed, the decrease in temperature may induce phase changes which change the structure or even destroy the crystals. To avoid these problems, an oil may be used to coat the protein crystal before it is immersed in the cooled nitrogen stream. However, coating with oil is not always effective and above all gives rise to background noise which reduces the quality of the data recorded during the analyses. Another solution consists in using cryoprotective molecules. However, these cryoprotective molecules may modify the solubility of the crystals, the protein structure and/or the protein conformation. Furthermore, cryogenics works even more poorly when the protein crystals are large (between 0.1 and 1 mm$^3$) as is the case, for example, for neutron diffraction. In this case, the crystals rarely withstand the treatment.

Another conventional solution consists in depositing a film around the substrate to be protected using a composition comprising an ionic surfactant. This conventional solution is described in patent application WO 2007/132089 and involves liquid compositions in which the concentration of ionic surfactant is greater than or equal to the critical micelle concentration (CMC) of said surfactant. This conventional solution has been used to deposit a film comprising graphene and an ionic surfactant onto various types of substrates (Azevedo et al. ACS Applied Materials & Interfaces 7(38) 21270-21277 (2015)), and in particular onto protein crystals (Wierman et al. Journal of Applied Crystallography 46, 1501-1507 (2013)). Although the film of graphene and ionic surfactant can protect the protein crystal against air, it is not sufficiently reliable since it may comprise holes.

TECHNICAL PROBLEM

There is thus still a need for an effective solution for preserving protein crystals in order to be able to place them in an X-ray beam to study their three-dimensional structure.

The inventors have, to their credit, found that this need can be met by means of a liquid composition comprising a neutral surfactant and a charged lamellar compound.

SUMMARY

Thus, a first aspect of the invention is a process for depositing a film onto a substrate using a liquid composition, comprising the following steps:
a) formation of a film using the liquid composition,
b) placing the film in contact with the substrate, and
c) depositing the film on the substrate,
characterized in that the liquid composition comprises a neutral surfactant and a charged lamellar compound.

Advantageously, the liquid composition comprising a neutral surfactant and a charged lamellar compound makes it possible to form a film which effectively protects the substrate, in particular a protein crystal, onto which said film is deposited via the process according to the invention. Indeed, a protein crystal onto which a film is deposited via the process according to the invention does not degrade in the open air for a period of more than one month, whereas a protein crystal onto which no film is deposited degrades within a few minutes.

In contrast with cryogenics, the film deposited onto a protein crystal via the process according to the invention does not change the solubility of said protein crystal, does not destroy said protein crystal and does not change either the structure or the conformation of the protein.

Furthermore, the film deposited onto a protein crystal via the process according to the invention does not impair the quality of the analyses that can be performed on said crystal. For example, the film does not give rise to background noise which reduces the quality of the data recorded during these analyses.

The process of the invention is also suitable for protecting large protein crystals, which, once the film has been deposited, can be analyzed by neutron diffraction.

According to another aspect, a process is proposed for analyzing a substrate onto which a film is deposited, comprising the steps of the process of depositing a film onto a substrate using a liquid composition and a step d) of analyzing the substrate onto which a film is deposited.

According to another aspect, a liquid composition comprising a neutral surfactant and a charged lamellar compound is proposed, in which:
the neutral surfactant is chosen from a nonionic surfactant, a zwitterionic surfactant, an amphoteric surfactant and mixtures thereof, and
the charged lamellar compound is chosen from a lamellar clay, a lamellar hydroxide, a lamellar double hydroxide, $H_{3(1-x-y-z)}Li_{3x}Na_{3y}K_{3z}Sb_3P_2O_{14}$ with $0 \leq x \leq 1$; $0 \leq y \leq 1$; $0 \leq z \leq 0.5$ and $0 \leq x+y+z \leq 1$, $H_{(1-x-y-z)}Li_xNa_yK_zSbP_2O_8$ with $0 \leq x \leq 1$; $0 \leq y \leq 1$; $0 \leq z \leq 0.5$ and $0 \leq x+y+z \leq 1$, a lamellar oxide, a lamellar perovskite, a lamellar phosphate, a lamellar sulfide, a lamellar halide, a lamellar carbide and mixtures thereof.

BRIEF DESCRIPTION OF THE DRAWINGS

FIG. 1 shows a device for performing the process according to the invention.

FIG. 2 shows the device during the implementation of the process, i.e. when the film is formed (a), during the placing in contact of the film with the substrate (b) and when the film is deposited onto the substrate (c).

FIG. 3 shows optical microscopy images of a lysozyme crystal onto which no film is deposited under its stability conditions (a) and 5 minutes after placing it in the open air (b).

FIG. 4 shows optical microscopy images of a lysozyme crystal onto which a film is deposited under the conditions of Example 1 under its stability conditions (a), 5 minutes after placing it in the open air (b) and more than one month after placing it in the open air (c).

FIG. 5 is a monocrystalline XRD image showing the reciprocal network of a lysozyme crystal onto which a film is deposited under the conditions of Example 1.

FIG. 6 is a monocrystalline XRD image of a peak detected during the acquisition of the intensities of a lysozyme crystal onto which a film is deposited under the conditions of Example 1.

DETAILED DESCRIPTION

According to a first aspect, the invention is a process for depositing a film onto a substrate using a liquid composition, comprising the following steps:
  a) formation of a film using the liquid composition,
  b) placing the film in contact with the substrate, and
  c) depositing the film on the substrate,
characterized in that the liquid composition comprises a neutral surfactant and a charged lamellar compound.

For the purposes of the present invention, the term "charged lamellar compound" refers to a chemical compound whose crystal structure consists of two-dimensional charged sheets (along the x and y axes) stacked in the third dimension (along the z-axis) and separated by ionic layers. The bonds between the atoms of the two-dimensional charged sheets are mainly covalent (directional and strong), whereas those between the two-dimensional charged sheets and the ionic layers are ionic (non-directional). Graphene is not a charged lamellar compound for the purposes of the present invention since it does not comprise any ionic layers between two-dimensional sheets.

For the purposes of the present invention, the term "neutral surfactant" means a molecule comprising a lipophilic (apolar) part and a hydrophilic (polar) part and which is not ionized.

Without wishing to be bound by any theory, the inventors are of the opinion that the film formed in step a) comprises sheets of the charged lamellar compound and the neutral surfactant, and that, in step c), the neutral surfactant facilitates the condensation of the sheets on the substrate to be protected so as to form an insulating and protective film on the substrate.

According to one embodiment, the neutral surfactant is chosen from a nonionic surfactant, a zwitterionic surfactant, an amphoteric surfactant and mixtures thereof, in particular a nonionic surfactant.

For the purposes of the present invention, the term "nonionic surfactant" means a surfactant in which the lipophilic part and the hydrophilic part are not charged.

For the purposes of the present invention, the term "zwitterionic surfactant" means a surfactant in which one of the lipophilic and hydrophilic parts is positively charged, the other being negatively charged. The zwitterionic surfactant is chosen in particular from the compounds having the following formula:

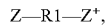

in which
  R1 represents a $C_1$-$C_{20}$ and in particular $C_1$-$C_{14}$ alkyl chain,
  $Z^-$ represents a negatively charged function borne by R1, in particular from among sulfate and carboxylate functions,
  $Z^+$ represents a positively charged function, in particular an ammonium.

A person skilled in the art will know how to adapt the pH of the liquid composition used in the deposition process of the invention and comprising a zwitterionic surfactant so that said zwitterionic surfactant is neutral or slightly charged, in particular neutral.

For the purposes of the present invention, the term "amphoteric surfactant" means a surfactant whose hydrophilic part is both positively and negatively charged. A person skilled in the art will know how to adapt the pH of the liquid composition used in the deposition process of the invention and comprising an amphoteric surfactant so that said amphoteric surfactant is neutral or slightly charged, in particular neutral.

The nonionic surfactant may be any type of nonionic surfactant known to those skilled in the art. Typically, the nonionic surfactant may be an ethoxylated alcohol, an ethoxylated alkylphenol, an ethoxylated fatty acid, an ethoxylated monoalkanolamide, an ethoxylated sorbitan ester, an ethoxylated amine, a glycol ester, a glycerol ester, a polyglycerol ester, a sorbitol ester, a glucoside, a polyglucoside such as an alkyl polyglucoside, a sucrose ester, an amine oxide such as lauryldimethylamine oxide, a block copolymer including at least one amphiphilic block or mixtures thereof, in particular a block copolymer including at least one amphiphilic block.

The ethoxylated alcohol may be, for example, a polyoxyethylene glycol dodecyl ether, an octaethylene glycol monododecyl ether, a pentaethylene glycol monododecyl ether or mixtures thereof.

Ethoxylated alkylphenols that may be mentioned include polyethylene glycol nonylphenyl ether and a polyethylene glycol p-(1,1,3,3-tetramethylbutyl)phenyl ether.

Typically, the ethoxylated amine may be polyoxyethyleneamine, cocamide monoethanolamine, cocamide diethanolamine or mixtures thereof.

For example, the glycerol ester may be glyceryl monostearate, glyceryl monolaurate or a mixture thereof.

Typically, the sorbitol ester may be chosen from sorbitan monolaurate, sorbitan monostearate, sorbitan tristearate, polyoxyethylene sorbitan monolaurate or Polysorbate 20, polyoxyethylene sorbitan monopalmitate or Polysorbate 40, polyoxyethylene sorbitan monostearate or Polysorbate 60, polyoxyethylene sorbitan tristearate or Polysorbate 65, polyoxyethylene sorbitan monooleate or Polysorbate 80 and mixtures thereof.

The alkyl polyglucoside may be, for example, a decyl glucoside, a lauryl glucoside, an octyl glucoside or mixtures thereof.

In general, any amphiphilic copolymer block known to those skilled in the art may be used. In particular, use is made of an amphiphilic block chosen from:
  fluoro unit blocks such as unit blocks having the formula —[$CH_2$13 $CH_2$—$CH_2$—$CH_2$—O—CO—R2]— with R2=$C_4F_9$ or $C_8F_{17}$,
  biological unit blocks such as polyamino acid unit blocks such as polylysine or alginate,
  dendrimer unit blocks, and poly(alkylene oxide) unit blocks such as hydrophobic poly(alkylene oxide) unit blocks and hydrophilic poly(alkylene oxide) unit blocks, in particular poly(alkylene oxide) unit blocks.

The surfactant may be a block copolymer bearing two, three or four blocks, one of these blocks being a poly(alkylene oxide) unit block. A diblock copolymer may comprise a hydrophilic poly(alkylene oxide) unit block and a hydrophobic poly(alkylene oxide) unit block. A triblock copolymer may comprise at least one hydrophilic poly(alkylene oxide) unit block and at least one hydrophobic poly(alkylene oxide) unit block, in particular two hydrophilic poly(alkylene oxide) unit blocks and one hydrophobic poly(alkylene oxide) unit block. A four-block copolymer may comprise at least one hydrophilic poly(alkylene oxide) unit block and at least one hydrophobic poly(alkylene oxide) unit block, in particular two hydrophilic poly(alkylene oxide) unit blocks and two hydrophobic poly(alkylene oxide) unit blocks.

The poly(ethylene oxide) unit, noted (PEO), is an example of a hydrophilic poly(alkylene oxide) unit block.

As hydrophobic poly(alkylene oxide) unit, mention may be made of the poly(propylene oxide) unit block (PPO), the poly(butylene oxide) unit block (PBO), and the mixed unit block in which each unit is a mixture of several alkylene oxide monomers, in particular the (PPO) unit block.

According to a particular embodiment, the surfactant may be a block copolymer of the formula $(PEO)_w$-$(PPO)_y$-$(PEO)_z$ where w is between 5 and 300, y is between 33 and 300 and z is between 5 and 300. For example, the values of w and z may be identical, and the surfactant may be a block copolymer of the formula $(PEO)_w$-$(PPO)_y$-$(PEO)_z$ in which w=20, y=70 and z=20 (P123) or in which w=106, y=70 and z=106 (F127).

The nonionic surfactant may be chosen, for example, from the commercial nonionic surfactants known under the name Pluronic (BASF), such as Pluronic P123, Pluronic F127 or mixture(s) thereof, Tetronic (BASF), Triton (Sigma) such as Triton X100, Triton X100-R or a mixture thereof, Tergitol (Union Carbide), Brij (Aldrich) such as Brij 35, Tween (Roth) such as Tween 20, Tween 80 or mixtures thereof.

As zwitterionic surfactants, mention may notably be made of sodium N,N-dimethyldodecylammoniumbutanate, sodium dimethyldodecylammoniumpropanate and amino acids, dodecylphosphocholine (C12PC), phospholipids such as dimyristoyl phosphatidylcholine, dipalmitoyl phosphatidylcholine, dioleoyl phosphatidylcholine, dimyristoyl phosphatidylethanolamine, dipalmitoyl phosphatidylethanolamine and dioleoyl phosphatidylethanolamine.

Amphoteric surfactants that may notably be mentioned include disodium lauroamphodiacetate, and betaines such as alkyl amidopropylbetaine or laurylhydroxysulfobetaine.

The charged lamellar compound of the invention may be chosen from a lamellar clay, a lamellar hydroxide, a lamellar double hydroxide, $H_{3(1-x-y-z)}Li_{3x}Na_{3y}K_{3z}Sb_3P_2O_{14}$ with $0 \leq x \leq 1$; $0 \leq y \leq 1$; $0 \leq z \leq 0.5$ and $0 \leq x+y+z \leq 1$, $H_{(1-x-y-z)}Li_xNa_yK_zSbP_2O_8$ with $0 \leq x \leq 1$; $0 \leq y \leq 1$; $0 \leq z \leq 0.5$ and $0 \leq x+y+z \leq 1$, a lamellar oxide, a lamellar perovskite, a lamellar phosphate, a lamellar sulfide, a lamellar halide, a lamellar carbide and mixtures thereof, in particular $H_{3(1-x-y-z)}Li_{3x}Na_{3y}K_{3z}Sb_3P_2O_{14}$ with $0 \leq x \leq 1$; $0 \leq y \leq 1$; $0 \leq z \leq 0.5$ and $0 \leq x+y+z \leq 1$, $H_{(1-x-y-z)}Li_xNa_yK_zSbP_2O_8$ with $0 \leq x \leq 1$; $0 \leq y \leq 1$; $0 \leq z \leq 0.5$ and $0 \leq x+y+z \leq 1$, more particularly $H_{3(1-x-y-z)}Li_{3x}Na_{3y}K_{3z}Sb_3P_2O_{14}$ with $0 \leq x \leq 1$; $0 \leq y \leq 1$; $0 \leq z \leq 0.5$ and $0 \leq x+y+z \leq 1$, even more particularly $H_3Sb_3P_2O_{14}$ or $Li_3Sb_3P_2O_{14}$, most particularly $H_3Sb_3P_2O_{14}$.

Examples of lamellar clays that may be used are clays of the smectite family such as bentonite, beidellite, hectorite, laponite, montmorillonite, nontronite or mixtures thereof, in particular nontronite. Other examples of lamellar clays that may be used are phyllosilicates such as mica or vermiculite, or mixtures thereof.

Lamellar hydroxides that may be used include $Ni(OH)_2$, $Co(OH)_2$ and $Al(OH)_3$, in particular gibbsite.

Typically, the lamellar double hydroxide (LDH) may be chosen from the compounds of formula $[M1^{2+}_{1-x}M2^{3+}_x(OH)_2]^{x+}(A^{n-}_{x/n}) \cdot zH_2O$, in which $[M1^{2+}_{1-x}M2^{3+}_x(OH)_2]^{x+}$ indicates that each LDH sheet consists of a structure of brucite type $(Mg(OH)_2)$ bearing a net positive charge $(^{x+})$ originating from the partial replacement of the trivalent metal cation $M2^{3+}$ with a divalent metal cation $M1^{2+}$;

x, which is between 0.17 and 0.33, is the mole ratio $M2^{3+}/(M1^{2+}+M2^{3+})$; the divalent metal cation $M1^{2+}$ may be $Mg^{2+}$, $Mn^{2+}$, $Fe^{2+}$, $Co^{2+}$, $Ni^{2+}$, $Cu^{2+}$, $Zn^{2+}$, $Ga^{2+}$ or mixtures thereof;

the trivalent metal cation $M2^{3+}$ may be $Al^{3+}$, $Cr^{3+}$, $Mn^{3+}$, $Fe^{3+}$, $Co^{3+}$, $Ni^{3+}$, $La^{3+}$ or mixtures thereof;

the interlamellar anion $A^{n-}$ may be $OH^-$, $NO_3^-$, $Cl^-$, $ClO_4^-$, $CO_3^{2-}$, $SO_4^{2-}$, an organic anion or mixtures thereof.

The LDH may also be an exfoliable LDH such as those described in the article by Mao et al. Applied Clay Science 144, 60-78 (2017) or in the article by Hou et al. Colloids and Surfaces A: Physicochem. Eng. Aspects 312 92-98 (2008), for instance the lamellar double hydroxide Ni/Fe (Ni/Fe LDH) with 11-aminoundecanoic acid (AUA) as species of the ionic layers, for instance Ni/Fe LDH-AUA with Ni/Fe=4.

The lamellar oxide may be $MoO_3$, $MnO_2$, $TiO_2$ in particular rutile, $V_2O_5$, $WO_3$, ZnO or mixtures thereof.

The lamellar perovskite may be chosen, for example, from $Cs_{0.7}Ti_{1.825}O_4$, $K_{0.45}MnO_2$, $K_4Nb_6O_{17}$, $TBA_xH_{1-x}Ca_2Nb_3O_{10}$, $HCa_2Nb_3O_{10}$, $HSr_2Nb_3O_{10}$, $HCaLaNb_2TiO_{10}$, $HLaNb_2O_7$ and mixtures thereof, in particular $TBA_xH_{1-x}Ca_2Nb_3O_{10}$ or $HSr_2Nb_3O_{10}$, $HCa_2Nb_3O_{10}$, $HLaNb_2O_7$ and mixtures thereof.

The lamellar phosphate may be chosen, for example, from the aluminum phosphates listed in the review article by Wang et al. Journal of Colloid and Interface Science 285 (2005) 731-736, for instance $[Al_3P_4O_{16}]^{3-} \cdot 3[CH_3(CH_2)NH_3]^+$.

The liquid composition is obtained by mixing the charged lamellar compound with a solution comprising the neutral surfactant, in particular an aqueous solution comprising the neutral surfactant.

According to one embodiment, the concentration of neutral surfactant in this solution is below the critical micelle concentration (CMC) of said neutral surfactant. The CMC of the neutral surfactant is determined at 25° C. in the solvent of the solution. For example, the CMC of the neutral surfactant is determined at 25° C. in deionized water having a resistivity of 18 Megohm·cm when the solution is an aqueous solution.

A concentration of neutral surfactant below the critical micelle concentration (CMC) of said neutral surfactant makes it possible to reduce the amount of neutral surfactant in the film and thus to increase the mole ratio of charged lamellar compound to neutral surfactant in the film. Without wishing to be bound by any theory, the inventors are of the opinion that this increase in the ratio allows an increase in the amount of sheets of charged lamellar compound in the film and advantageously improves the protection of the substrate against gases such as air.

According to a particular embodiment, the concentration of neutral surfactant in this solution is less than 0.95 CMC of said surfactant, in particular from 0.01 CMC to 0.75 CMC of said surfactant, most particularly from 0.15 CMC to 0.5 CMC of said surfactant.

In a very particular embodiment, the neutral surfactant is a compound of formula $(PEO)_w\text{-}(PPO)_y\text{-}(PEO)_z$ in which w=20, y=70 and z=20, such as Pluronic P123, and its concentration before mixing with the charged lamellar compound is from 0.10 CMC to 0.5 CMC, in particular from 0.15 CMC to 0.25 CMC, most particularly from 0.18 CMC to 0.22 CMC. According to Alexandridis et al. Micellization of Poly(Ethylene Oxide)-Poly(Propylene Oxide)-Poly(Ethylene Oxide) Triblock Copolymers in Aqueous Solutions—Thermodynamics of Copolymer Association. Macromolecules 1994, 27, 2414-2425, the CMC of Pluronic P123 is $0.052 \times 10^{-3}$ M at 25° C.

The liquid composition comprises a solvent. The solvent may be chosen according to the neutral surfactant employed. Typically, the solvent will be chosen from polar solvents and more particularly from polar protic solvents. Thus, for example, the solvent may be chosen from water, toluene, acetic acid, methanol, ethanol, acetonitrile, dimethylformamide, dimethyl sulfoxide, N-methylformamide, chloroform and mixtures thereof. In particular, the solvent is water or comprises water when a solvent mixture is employed.

In general, any type of substrate may be used in the process according to the invention. Thus, it is possible to deposit a film on an organic substrate or an inorganic substrate via the process according to the invention.

According to one embodiment, the organic substrate may be chosen from a polymer, biological material, an organic semiconductor and an organic light-emitting diode (OLED).

According to one embodiment, the inorganic substrate may be chosen from a ceramic, an aluminum oxide, a silicon substrate, a semiconductor material, a metal and a light-emitting diode (LED). The organic substrate may be in crystalline, semicrystalline or amorphous form.

The substrate may be porous or non-porous.

According to a particular embodiment, the substrate is biological material chosen from a protein or a protein crystal. For example, the protein crystal may be a crystal of a globular protein such as lysozyme, in particular a crystal of a globular protein having high solubility in solution of the crystallization condition under consideration. The protein crystal may also be a crystal of a membrane protein, in particular a crystal of a membrane protein having low solubility in solution of the crystallization condition under consideration.

Typically, the protein crystal may have a volume of from $0.1 \text{ mm}^3$ to $1 \text{ mm}^3$.

According to a particular embodiment, the surfactant is a compound of formula $(PEO)_w\text{-}(PPO)_y\text{-}(PEO)_z$ in which w is between 5 and 300 and y is between 33 and 300 and z is between 5 and 300, the charged lamellar compound is $H_{3(1-x-y-z)}Li_{3x}Na_{3y}K_{3z}Sb_3P_2O_{14}$, $0 \leq x \leq 1$; $0 \leq y \leq 1$; $0 \leq z \leq 0.5$ and $x+y+z=1$, and the substrate is a protein crystal.

According to a very particular embodiment, the surfactant is a compound of formula $(PEO)_w\text{-}(PPO)_y\text{-}(PEO)_z$ in which w=20, y=70 and z =20, such as Pluronic P123, the charged lamellar compound is $H_3Sb_3P_2O_{14}$ or $Li_3Sb_3P_2O_{14}$ and the substrate is a lysozyme crystal.

Typically, depending on the substrate onto which the film is deposited, the liquid composition may have an acidic, neutral or basic pH. A person skilled in the art will know how to adapt the pH of the liquid composition according to the substrate onto which the film is deposited.

According to a first variant, the liquid composition has an acidic pH, in particular from 2 to 6, more particularly from 3 to 4. Advantageously, the film formed from a liquid composition having an acidic pH makes it possible to further stabilize a lysozyme crystal.

According to a second variant, the liquid composition has a basic pH, in particular from 8 to 12, more particularly from 11 to 10. A liquid composition having a basic pH may advantageously be used to deposit a film onto polymers or metals.

Step a) of forming a film using the liquid composition may be performed via various processes known to those skilled in the art. For example, this step a) may be performed by forming a film in the form of a bubble using the liquid composition and by depositing said bubble onto a support. The bubble may be hemispherical in shape, in which case it is referred to as a half-bubble, quasi-planar in shape or concave in shape, in particular hemispherical in shape. The size of the bubble is not limited and depends on the size of the substrate onto which the film is to be deposited. Typically, the radius of the half-bubble may be several tens of centimeters, in particular between 1 mm and 5 cm.

This step a) may also be performed like the step of forming a film using a solution described in patent application WO 2007/132089.

Step b) of placing in contact the film formed using the liquid composition may conventionally be performed by relative movement of the substrate with respect to the surface of the film. Thus, the substrate may be moved to establish contact with the film, the film may be moved to establish contact with the substrate or the film and the substrate may be moved to establish contact with each other.

When contact is established between the film and the substrate, molecular interactions are established which allow strong adhesion between the film and the substrate. Step c) of depositing the film on the substrate is then performed.

The process for depositing a film according to the invention can advantageously be performed in a closed and in particular sealed cell. Furthermore, the process according to the invention can be performed under a neutral atmosphere, which is controlled or saturated with solvent of the liquid composition, in particular under an atmosphere saturated with solvent of the liquid composition.

Advantageously, the stability of the film during steps a) and b) is increased when the process is performed under an atmosphere saturated with solvent of the liquid composition.

Typically, a controlled atmosphere may be an oxygen-free atmosphere, under nitrogen or under $CO_2$.

According to one embodiment, steps a) to c) of the process for depositing a film may be repeated. Advantageously, the repetition of steps a) to c) of the process allows the deposition of a multilayer film whose protective and insulating properties can be enhanced and controlled relative to a monolayer film. Such a multilayer film is, for example, very advantageous when the substrate is a semiconductor or an organic light-emitting diode.

Typically, steps a) to c) may be repeated with the same liquid composition or with at least one different liquid composition.

According to a particular embodiment, the process for depositing a film according to the invention may be performed using a device 1 comprising:
  a reaction cell 11, which in particular is transparent to allow optical monitoring of the process
  a lid 12 adapted to isolate, in particular in a leaktight manner, the reaction cell 11 from the external environment, a film support 13,
a substrate support 14, and
a means for relative movement of the substrate support 14 with respect to the film support 13.

According to another aspect, the invention relates to the device 1 as described above for depositing a film onto a substrate using a liquid composition comprising a neutral surfactant and a charged lamellar compound.

Typically, the device 1 may be produced by 3D printing.

According to one embodiment, the film support 13 comprises an absorbent material such as one or more filter papers, fabric, or a sponge. Advantageously, this absorbent material may be soaked with the liquid composition and thus stabilize the film.

According to an alternative embodiment, the film support 13 may be a bubble ring. Advantageously, the periphery of the bubble ring enables the film to be stabilized.

The substrate support 14 is adapted to receive the substrate onto which the film is deposited. It may thus be made of any material suitable for receiving the substrate, said material being chosen from a polymer, a glass, a metal, kapton, silicon, a porous ceramic, a non-porous ceramic, a porous aluminum oxide, a non-porous aluminum oxide and mixtures thereof.

The means for relative movement may be a means 15 for moving the substrate support 14 to the film support 13, a means for moving the film support 13 to the substrate support 14 (not shown in the figures), or both movement means, in particular the means 15 for moving the substrate support 14 to the film support 13.

Typically, the means for relative movement may allow translation of the substrate support 14 to the film support 13, of the film support 13 to the substrate support 14, or translation of the substrate support 14 to the film support 13 and translation of the film support 13 to the substrate support 14. Any means allowing such translation can be implemented in the device 1.

According to one embodiment, the movement means 15 comprises an actuator and a support on which the substrate support is placed 14.

The process for depositing a film according to the invention formed by the device 1 may comprise, for example, before step a), a step of preparing the reaction cell 11.

This preparation step may be performed, for example, by partially immersing the film support 13 in a solution comprising the neutral surfactant and a solvent placed in the reaction cell 11 and then isolating the reaction cell 11 from the outside environment by means of the lid 12 for a period that may be greater than or equal to 0.5 min, in particular from 2 min to 30 min, most particularly from 5 min to 15 min.

Advantageously, the atmosphere in the reaction cell 11 at the end of this preparation step is saturated with solvent and advantageously promotes the stability of the film during steps a) and b).

Step a) of the process according to the invention may be formed by depositing a film onto the film support 13, in particular onto the film support 13 partially immersed during the preparation step.

Step b) of the process according to the invention may then be performed using the means for relative movement of the substrate support 14 which supports the substrate onto which the film is to be deposited relative to the film support 13. Step b) is in particular performed with the aid of the movement means 15.

Step c) is performed when the substrate supported by the substrate support 14 comes into contact with the film in the form of a half-bubble deposited onto the film support 13.

The process according to the invention may also be performed with the device described in patent application WO 2007/132089.

The device described in patent application WO 2007/132089 advantageously allows steps a) to c) to be repeated to deposit a multilayer film onto a substrate.

The substrate onto which the film has been deposited via the process according to the invention can be analyzed by any known analytical technique suitable for the analysis of said substrate.

According to another aspect, the invention also relates to a process for analyzing a substrate onto which a film is deposited, comprising the steps of the process of depositing a film, which is the first aspect of the invention, and a step d) of analyzing the substrate onto which a film is deposited.

Step d) of analyzing the substrate may be performed by any analytical technique that is suitable for the substrate and known to those skilled in the art. For example, analysis step d) may be performed by X-ray diffraction, neutron diffraction, plasmon resonance, electron microscopy, atomic force microscopy (AFM), X-ray or neutron reflectivity, confocal optical microscopy or mixtures thereof.

Advantageously, the analytical process according to the invention makes it possible to determine the structure of a protein of a protein crystal by means of X-ray diffraction and neutron diffraction.

According to another aspect, the invention relates to a liquid composition comprising a neutral surfactant and a charged lamellar compound.

The liquid composition according to this other aspect of the invention is as described above in connection with the process for depositing a film, which is the first aspect of the invention.

EXAMPLES

Example 1: The Substrate is a Lysozyme Crystal

Example 1-1: Deposition of a Film Obtained from Pluronic P123 (Nonionic Surfactant) and $H_3Sb_3P_2O_{14}$ (Charged Lamellar Compound) onto a Lysozyme Crystal (Substrate).

Device 1.

Device 1 used in Example 1 is illustrated in FIG. 1. Device 1 comprises a transparent reaction cell 11 allowing optical monitoring, a lid 12 suitable for isolating the reaction cell 11 in a leaktight manner from the external environment and comprising a through-hole, a film support 13 consisting of superimposed filter papers, a substrate support 14 which is a glass plate, and a means 15 for moving the substrate support 14 to the film support 13. The moving means 15 comprises an actuator and a support on which the substrate support 14 is placed and passes through the lid 12 via the through-hole of the lid 12.

The Liquid Composition Comprising Pluronic P123 and $H_3Sb_3P_2O_{14}$

The liquid composition used in this Example 1 is obtained by mixing 1 mL of $H_3Sb_3P_2O_{14}$ at a mass concentration of 16 mg/mL with 1 mL of Pluronic P123 with a concentration equal to 0.2 CMC.

The Operating Protocol.

The operating protocol followed during Example 1 is illustrated by FIG. 2.

9 ml of an aqueous solution of Pluronic P123 were poured into the reaction cell 11 in order to saturate the atmosphere of the reaction cell 11 with water vapor. Next, the film support 13 (superposition of filter papers) was partially immersed in the Pluronic P123 solution in the center of the reaction cell 11. The reaction cell 11 was then closed with the lid 12 for more than 10 minutes so that the atmosphere of the reaction cell 11 was saturated with water and thus had the conditions for the stabilization of the film in the form of a half-bubble. A pasteur pipette was used to make the half-bubble. A very small volume (less than 1 mL) of the liquid composition comprising Pluronic P123 and $H_3Sb_3P_2O_{14}$ was taken up with the pasteur pipette. The pasteur pipette was placed just above the film support 13. A film in the form of a half-bubble was formed and deposited in the center of the film support 13 (FIG. 2*a*), immediately after the half-bubble film was formed, the water contained in the film began draining from the edges of the film. After 2 minutes of drainage, the lysozyme crystal on the substrate support 14 was moved toward the top of the half-bubble film by the moving means 15 until the film came into contact with the lysozyme crystal (FIG. 2*b*). The adhesion of the film was accompanied by its spreading and then almost instantaneous bursting. A film was then deposited onto the lysozyme crystal (FIG. 2*c*). The lysozyme crystal was then detached from the substrate support 14 and allowed to air-dry.

Comparative Example 1: Deposition of a Film Obtained from an Ionic Surfactant (Sodium Dodecyl Sulfate) and $H_3Sb_3P_2O_{14}$ (Charged Lamellar Compound) onto a Lysozyme Crystal (Substrate)

The same device and procedure as in Example 1 are applied, the difference being that the neutral nonionic surfactant, Pluronic P123, is replaced with an ionic surfactant, sodium dodecyl sulfate, in the liquid composition.

It was not possible to form the half-bubble film and thus to deposit it in the center of the film support 13. Specifically, the $H_3Sb_3P_2O_{14}$ nanoparticles flocculated when mixed with the sodium dodecyl sulfate.

Example 1-2: Comparative Study Between the Stability in Open Air of a Lysozyme Crystal Obtained in Example 1-1 and of a Lysozyme Crystal onto Which No Film is Deposited The lysozyme crystals were observed before and after film deposition under a polarized-light optical microscope (Axio Scope.A1).

FIG. 3 shows that after 5 minutes the crystal onto which no film is deposited is degraded and crystals of buffer salts have crystallized.

FIG. 4 shows that the crystal obtained in Example 1 is not degraded even after one month. Indeed, the crystal keeps its general morphology and remains birefringent and transparent even after one month.

Thus the results obtained showed that if the crystal onto which no film is deposited is placed in the open air, then it degrades within 5 minutes, whereas the crystal of Example 1 withstands being in the open air for more than one month.

Example 1-3: Study of the Crystallinity of the Lysozyme Crystal Obtained in Example 1-1

Single-crystal X-ray diffraction (XRD) analyses were performed on the crystal obtained in Example 1, four days after depositing the film.

The single-crystal XRD analyses were performed with the Oxford Diffraction Xcalibur system, with a monochromatic X-ray source (copper anode) and a CCD detector. The instrument was computer controlled using the CrysAlisPro data analysis software. The glass plate (microscope slide) on which the crystal is located was glued to a rigid sample holder and the crystal was then centered in the X-ray beam.

The XRD results showed that the sample was still crystalline 4 days after deposition of the film. Indeed, the XRD images show the reciprocal crystal lattice (FIG. 5) and a number of crystal diffraction peaks (FIG. 6). In particular, the images collected show intense peaks with an I/sigma factor=60 for the first peak observed. This proves the existence of crystalline order in the protein crystal. This result demonstrates that, crystallographically, the conservation of the crystal is very significantly improved relative to what can currently be achieved in the state of the art on millimeter-sized crystals in the absence of the crystallization stock solution.

Example 2: The Substrate is a Steel Plate

Example 2.1: Deposition of a Film Obtained from Pluronic P123 (Nonionic Surfactant) and $H_3Sb_3P_2O_{14}$ (Charged Lamellar Compound)

Device 1 used in Example 1 is used in this Example 2.

The liquid composition used in this Example 2.1 is obtained by mixing 1 mL of $H_3Sb_3P_2O_{14}$ with a mass concentration of 16 mg/mL with 1 mL of Pluronic P123 having a concentration equal to 0.16 CMC. This Example 2.1 is performed at 20° C.

The substrate used in this Example 2 is an unpolished commercial steel plate with a length of 2.5 cm, a width of 1.5 cm and a height of 0.2 cm.

The substrate was first cleaned with ethanol. It was then attached to the substrate support 14. To achieve the optimum bubble stabilization conditions, 1 ml of the liquid composition was poured into the reaction cell 11. The film support 13 (superposition of filter papers) soaked with the liquid composition was placed in the middle of the reaction cell 11. This served as a support on which the half-bubble film was placed before it was deposited onto the substrate. The reaction cell 11 was closed with the lid 12 for about 5 minutes so that the atmosphere in the reaction cell 11 became saturated with water and thus acquired the conditions for stabilizing the half-bubble film. A half-bubble film was then deposited onto the film support 13 and left to drain for about 10 seconds. The substrate was then brought to the top of the half-bubble film. Said film adopted a quasi-cylindrical geometry which instantly burst. A film was then deposited onto the substrate. This procedure was repeated several times to deposit a multilayer film on the substrate. After deposition of the multilayer film, the substrate was placed on a hotplate at 70° C. for 30 min.

Example 2.2: Comparative Study of the Anticorrosion Effect of the Sheet Obtained in Example 2-1 and of a Steel Sheet onto Which No Multilayer Film Has Been Deposited Dilute hydrochloric acid (0.001 M) was used to accelerate the corrosion effect.

A drop of dilute hydrochloric acid was poured onto the sheet obtained in Example 2-1 and onto a steel sheet onto which no multilayer film was deposited.

The drop of hydrochloric acid did not corrode the sheet obtained in Example 2-1. However, the drop of hydrochloric acid did corrode the sheet onto which no multilayer film has been deposited.

The invention claimed is:

1. A process for depositing a film onto a substrate using a liquid composition, comprising the following steps:
   a) formation of a film in the form of a bubble using the liquid composition,
   b) placing the film in the form of a bubble in contact with the substrate, and
   c) depositing the film in the form of a bubble on the substrate,
   wherein the liquid composition comprises a neutral surfactant and a charged lamellar compound, in which the liquid composition is obtained by mixing the charged lamellar compound with the neutral surfactant and the concentration of neutral surfactant before mixing with the charged lamellar compound is less than 0.95 of the critical micelle concentration (CMC) of said surfactant.

2. The deposition process as claimed in claim 1, in which the neutral surfactant is chosen from a nonionic surfactant, a zwitterionic surfactant, an amphoteric surfactant and mixtures thereof.

3. The deposition process as claimed in claim 2, in which the neutral surfactant is a nonionic surfactant chosen from an ethoxylated alcohol, an ethoxylated alkylphenol, an ethoxylated fatty acid, an ethoxylated monoalkanolamide, an ethoxylated sorbitan ester, an ethoxylated amine, a glycol ester, a glycerol ester, a polyglycerol ester, a sorbitol ester, a glucoside, a polyglucoside, a sucrose ester, an amine oxide, a block copolymer including at least one amphiphilic block, and mixtures thereof.

4. The deposition process as claimed in claim 3, in which the nonionic surfactant is a block copolymer including at least one amphiphilic block chosen from fluoro unit blocks, biological unit blocks, dendrimer unit blocks and poly(alkylene oxide) unit blocks.

5. The deposition process as claimed in claim 1, in which the charged lamellar compound is chosen from a lamellar clay, a lamellar hydroxide, a lamellar double hydroxide, $H_{3(1-x-y-z)}Li_{3x}Na_{3y}K_{3z}Sb_3P_2O_{14}$ with $0 \leq x \leq 1$; $0 \leq y \leq 1$; $0 \leq z \leq 0.5$ and $0 \leq x+y+z \leq 1$, $H_{(1-x-y-z)}Li_xNa_yK_zSbP_2O_8$ with $0 \leq x \leq 1$; $0 \leq y \leq 1$; $0 \leq z \leq 0.5$ and $0 \leq x+y+z \leq 1$, a lamellar oxide, a lamellar perovskite, a lamellar phosphate, a lamellar sulfide, a lamellar halide, a lamellar carbide and mixtures thereof.

6. The deposition process as claimed in claim 1, in which the substrate is an organic substrate or an inorganic substrate.

7. The deposition process as claimed in claim 6, in which the organic substrate is chosen from a polymer, biological material, an organic semiconductor and an organic light-emitting diode.

8. The deposition process as claimed in claim 6, in which the inorganic substrate is chosen from a ceramic, an aluminum oxide, a silicon substrate, a semiconductor material, a metal and a light-emitting diode.

9. The deposition process as claimed in claim 1, in which the neutral surfactant is a compound of formula $(PEO)_w$-$(PPO)_y$-$(PEO)_z$ in which w is between 5 and 300 and y is between 33 and 300 and z is between 5 and 300, the charged lamellar compound is $H_{3(1-x-y-z)}Li_{3x}Na_{3y}K_{3z}Sb_3P_2O_{14}$ with $0 \leq x \leq 1$; $0 \leq y \leq 1$; $0 \leq z \leq 0.5$ and $x+y+z=1$ and the substrate is a protein crystal.

10. The deposition process as claimed in claim 1, in which steps a) to c) are repeated.

11. The deposition process as claimed in claim 1, wherein the concentration of neutral surfactant before mixing with the charged lamellar compound is from 0.15 to 0.5 of the CMC of the neutral surfactant.

12. The deposition process as claimed in claim 1, wherein the substrate comprises a protein or a protein crystal.

13. The deposition process as claimed in claim 1, wherein steps a) to c) are repeated to form a multilayer film.

14. A process for analyzing a substrate onto which a film is deposited, comprising the steps of the process of depositing a film as defined in claim 1 and a step d) of analyzing the substrate onto which a film is deposited.

15. The process for analyzing a substrate onto which a film is deposited as claimed in claim 14, wherein the analyzing comprises one or more of X-ray diffraction and neutron diffraction.

* * * * *